(12) United States Patent
Kaneyama

(10) Patent No.: US 7,977,630 B2
(45) Date of Patent: Jul. 12, 2011

(54) ELECTRON MICROSCOPE

(75) Inventor: Toshikatsu Kaneyama, Tokyo (JP)

(73) Assignee: JEOL Ltd., Tokyo (JP)

( * ) Notice: Subject to any disclaimer, the term of this patent is extended or adjusted under 35 U.S.C. 154(b) by 1460 days.

(21) Appl. No.: 11/102,483

(22) Filed: Apr. 8, 2005

(65) Prior Publication Data

US 2005/0242284 A1    Nov. 3, 2005

(30) Foreign Application Priority Data

Apr. 8, 2004  (JP) ................................. 2004-114513

(51) Int. Cl.
*H01J 44/00*   (2006.01)
(52) U.S. Cl. ...................... 250/305; 250/310; 250/396 R
(58) Field of Classification Search ................... 250/305
See application file for complete search history.

(56) References Cited

U.S. PATENT DOCUMENTS

| 4,789,787 | A  | * | 12/1988 | Parker ..................... 250/396 ML |
| 5,414,261 | A  | * | 5/1995  | Ellisman et al. ............... 250/311 |
| 6,770,887 | B2 | * | 8/2004  | Krivanek et al. .......... 250/396 R |
| 2002/0153484 | A1 | | 10/2002 | Kaneyama |

FOREIGN PATENT DOCUMENTS

JP         61-049363         3/1986

* cited by examiner

*Primary Examiner* — Phillip A Johnston
(74) *Attorney, Agent, or Firm* — The Webb Law Firm

(57) ABSTRACT

There is disclosed an electron microscope that achieves low-magnification imaging while the objective lens is kept at high excitation in the same way as during high-magnification imaging. An objective minilens located immediately behind the objective lens demagnifies a specimen image magnified by the objective lens. Consequently, a sharply focused electron beam enters the first intermediate lens. This greatly reduces the effects of off-axis aberrations in the intermediate lenses. The first, second, and third intermediate lenses create a crossover image and a microscope image in the entrance window plane and entrance image plane, respectively, of an energy filter. The energy filter focuses the microscope image and crossover image onto the exit image plane and exit window plane, respectively. The output image from the filter is projected onto the final image plane by first and second projector lenses.

8 Claims, 5 Drawing Sheets

ELECTRON MICROSCOPE

BACKGROUND OF THE INVENTION

1. Field of the Invention

The present invention relates to an electron microscope and, more particularly, to a transmission electron microscope equipped with an energy filter.

2. Description of Related Art

Conventionally, transmission electron microscopes (TEMs) equipped with energy filters have been offered. A transmission electron microscope equipped with an energy filter can select and image only electron rays having certain energies from electrons transmitted through a specimen. The microscope has various functions: (1) it can enhance the contrast and resolution of the image; (2) it can obtain an energy-loss spectrum; and (3) it can obtain a two-dimensional distribution of constituent elements of a specimen.

FIG. 5 is a diagram showing the configuration ranging from a specimen to the final image plane of a transmission electron microscope equipped with an energy filter. An electron beam transmitted through a specimen 3a is focused by an objective lens 4 and forms an image. Then, the beam enters an intermediate lens system 5 consisting of a first intermediate lens 5a, a second intermediate lens 5b, and a third intermediate lens 5c. The intermediate lens system 5 brings the image created by the objective lens 4 into focus at an entrance window plane 24 of the energy filter 6. That is, the lenses located ahead of the energy filter 6 focus a crossover image and a microscope image in the entrance window plane 24 and entrance image plane 25, respectively, of the energy filter 6.

The energy filter 6 has a function of selecting only electrons having certain energies out of electrons transmitted through the specimen 3a. The operation of the energy filter 6 is described briefly below. Electrons are directed at the specimen 3a by a condenser lens 2 and pass through the specimen 3a. During this process, the electrons interact with atoms and electrons within the specimen 3a. As a result, the electrons lose energy. This is known as energy loss.

A slit 7 is positioned in an exit window plane 27 of the energy filter 6. Only electrons having undergone a certain energy loss are selected by the slit 7. Consequently, the composition or bonding of elements can be known by causing the energy filter 6 to analyze the distribution of electron energy losses.

Furthermore, an image of two-dimensional distribution of energy losses in the specimen 3a can be obtained by creating an image from the electron rays. This can be applied to analysis of the distribution of elements constituting the specimen 3a, or the contrast of the image can be improved.

When the crossover image and microscope image are made to enter the entrance window plane 24 and entrance image plane 25, respectively, the energy filter 6 creates a microscope image and a crossover image in the exit image plane 26 and exit window plane 27, respectively, in this way. Electron rays having certain energies and selected by the energy filter 6 impinge on a projector lens system 8 consisting of a first projector lens 8a and a second projector lens 8b.

The projector lens system 8 magnifies the microscope image created by the energy filter 6. That is, the lenses located behind the energy filter 6 project the image created by the energy filter 6 onto the final image plane 9a at a desired magnification factor. A fluorescent screen, photographic film, or scintillator of a CCD camera is positioned in the final image plane 9a. An observer directly observes the image or the image is taken by the CCD camera.

The lenses located ahead of the energy filter 6 are made up of an objective lens 4 and an intermediate lens system 5 in the same way as in an ordinary electron microscope equipped with no energy filter. The objective lens 4 acts to magnify an image of a specimen first. The lens magnifies the image at a large magnification factor of about 30 to 100 times. The image is magnified by the intermediate lens system 5, the energy filter 6, and the projector lens system 8 after that. As a result, the image is lastly magnified at a large magnification factor of about 1,000 to 1,000,000 times. The magnification of the projection lens system 8 is about 50 to 200 times. The intermediate lens system 5 acts to magnify and reduce the image. In the lenses of the microscope, the divergence angle is greatest at this objective lens 4. Therefore, the resolution of the microscope depends much on the performance of the objective lens 4. Generally, the performance is improved by increasing the intensity of the magnetic field produced by the objective lens 4 and concentrating the magnetic field distribution is a narrow area. This shortens the focal distance, which, in turn, increases the magnification.

This improves the performance of the electron microscope at high magnifications, but it becomes difficult to achieve low magnifications of about 500 to 10,000 times for the following reason. The image greatly magnified by the objective lens 4 must be demagnified and brought to a focus by the next intermediate lens system 5. For this purpose, it is necessary to focus electrons passing off the optical axis of the lens.

Lenses used in electron microscopes are electromagnetic lenses. It has been shown that these lenses achieve only convex lenses. For this reason, aberration correction relying on a combination with concave lenses as in an optical microscope cannot be made. In recent years, aberration correction systems using multipolar lenses have been often incorporated within electron microscopes. Although such a correction system is very complex and large in size, it is only capable of correcting spherical aberration in the objective lens 4. It is entirely unrealistic to correct off-axis aberrations in the intermediate lens system 5.

Therefore, in electron microscopes where the objective lens 4 has a high magnification, it is customary to restrict the imaging magnification to about 5,000 times or higher by strongly exciting the objective lens 4. In some cases, lower magnifications are achieved using objective lens 4 of lower magnification. In these cases, the performance of the objective lens 4 is low, and applications are limited to electron microscopes with low resolutions.

It is customary to lower the magnification by exciting the objective lens 4 less strongly or turning it off during low-magnification imaging. At this time, however, the performance of the objective lens 4 deteriorates severely, and the resolution of the electron microscope decreases. This implementation is limited to ultra-low magnifications of about less that 1,000 times.

The range of 500 to 10,000 times is a bridge area between optical microscopy and electron microscopy and, hence, is an important range of magnifications. If this range of magnifications is not achieved, the use of the electron microscope will be hindered. Therefore, the objective lens 4 is weakly excited or turned off consciously of the fact that the resolution is insufficient. The magnification is increased with the intermediate lens system 5. Alternative, the magnification is lowered with the intermediate lens system 5 in use while the objective lens 4 is kept excited strongly at the sacrifice of the image quality of peripheral portions.

In an attempt to improve this situation, a technique for achieving low magnifications of less than 10,000 times while maintaining high resolution of the objective lens 4 and good image quality of peripheral portions is disclosed in Japanese Patent Laid-Open No. 61-49363. In particular, an objective minilens for assisting the objective lens 4 is placed close to the specimen surface. The minilens is used together with the objective lens.

In an electron microscope equipped with an energy filter, however, it has been difficult to achieve a low-magnification mode while the objective lens 4 is kept strongly excited.

SUMMARY OF THE INVENTION

It is an object of the present invention to provide an electron microscope which is equipped with an energy filter and which can achieve low-magnification imaging while the objective lens is kept strongly excited in the same way as during high-resolution imaging.

This object is achieved by an electron microscope according to the present invention comprising: a main objective lens for creating a magnified image of a specimen; an objective minilens for demagnifying the magnified image; an intermediate lens system; and an energy filter. The intermediate lens system forms a crossover image in the entrance window plane of the energy filter in response to the demagnified image.

Preferably, the microscope is equipped with projector lenses for focusing the output image from the energy filter onto the final image plane.

Preferably, the objective lens can be used alone as well as in conjunction with the minilens.

Preferably, the magnified image created by the main objective lens is produced by strongly exciting the main objective lens.

Preferably, a field-limiting aperture is mounted immediately ahead of the intermediate lens system and at the crossover position of the image formed by the objective minilens.

The electron microscope of the present invention can achieve low-magnification imaging while the objective lens is kept excited strongly in the same way as during high-magnification imaging.

Other objects and features of the present invention will appear in the course of the description thereof, which follows.

DESCRIPTION OF THE PREFERRED EMBODIMENTS

The preferred embodiments of the present invention are hereinafter described.

Figure 1:
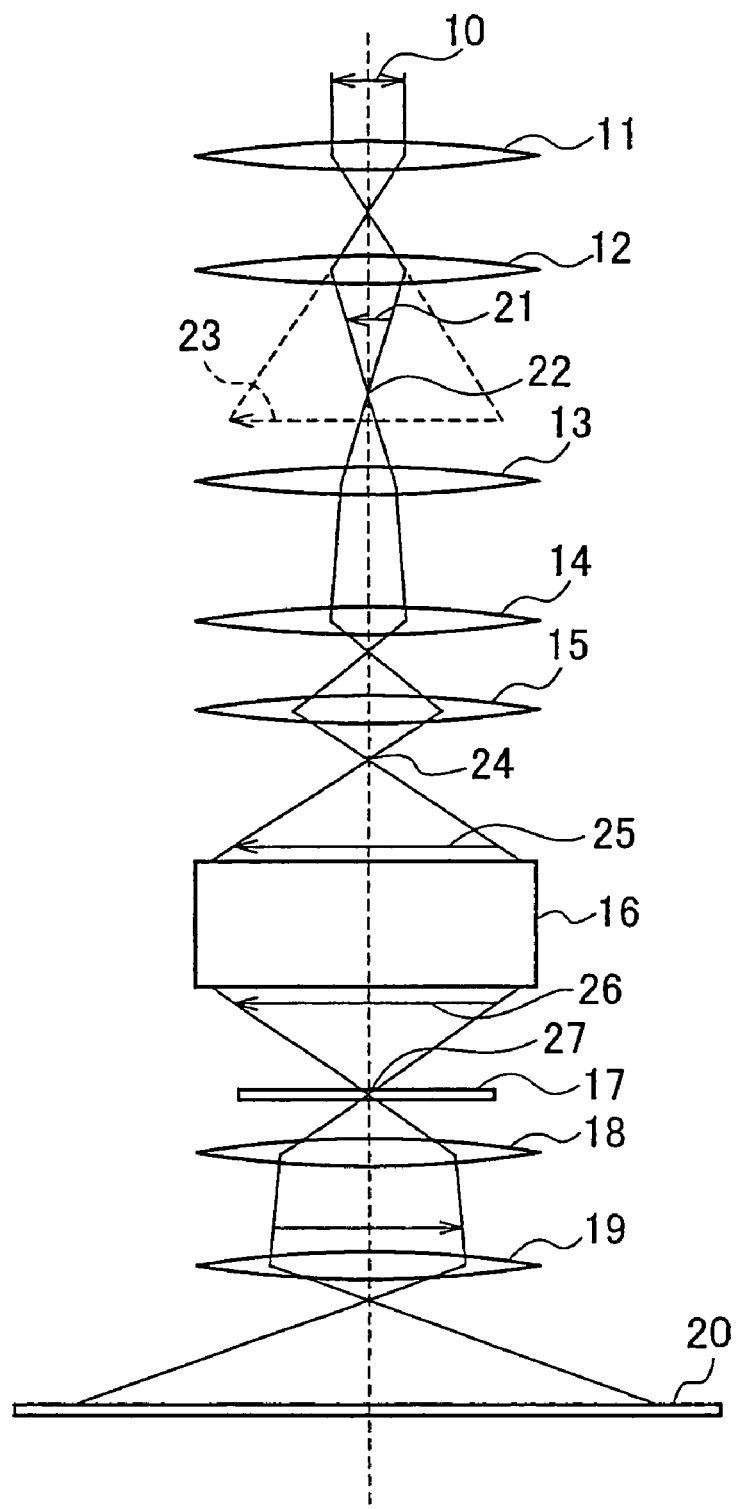
FIG. 1 is a ray diagram of an electron microscope according to a first embodiment of the present invention.

FIG. 1 shows a transmission electron microscope according to a first embodiment of the present invention. Indicated by reference number 10 is a specimen. The microscope has a main objective lens 11, an objective minilens 12, a first intermediate lens 13, a second intermediate lens 14, a third intermediate lens 15, an energy filter 16, an energy-selecting slit 17, a first projector lens 18, a second projector lens 19, and a final image plane 20.

A real image 21 is formed by the objective lens 11 and the objective minilens 12. A crossover position 22 is formed by the objective minilens 12. A virtual image 23 is formed by the main objective lens 11. The energy filter 16 has an entrance window plane 24, an entrance image plane 25, an exit image plane 26, and an exit window plane 27.

A magnetic filter making use of only a magnetic field is available as the energy filter 16. Various types of magnetic filters are known which are termed Omega filter, Alpha filter, Gamma filter, and mandolin-type filter because of their electron orbital geometries. Also, a Wien filter using superimposed electric and magnetic fields is known. In the present embodiment, an Omega filter is used as the energy filter 16 for convenience of illustration.

Figure 2:
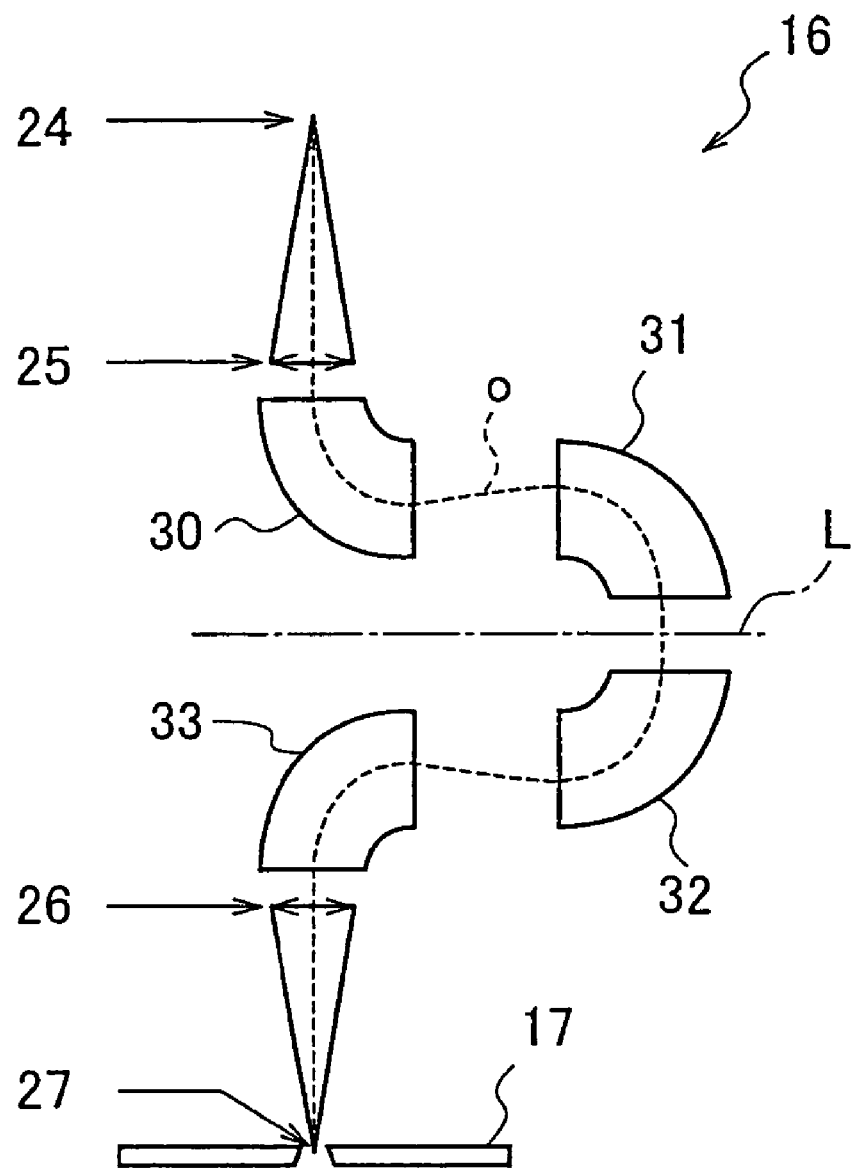
FIG. 2 is a schematic diagram of an Omega energy filter.

FIG. 2 shows the geometry of the Omega filter. This filter is made up of four electromagnets 30, 31, 32, and 33. The electromagnets 30 and 33 are arranged vertically symmetrically with respect to a centerline L in the figure. Also, the electromagnets 31 and 32 are arranged vertically symmetrically with respect to the centerline L. The broken line O indicates the center orbit of the electron beam in the Omega filter.

In FIG. 2, four positions 24, 25, 26, and 27 are defined. As mentioned previously, the entrance window plane 24, entrance image plane 25, exit image plane 26, and exit window plane 27 are defined. The energy-selecting slit 17 is placed in the exit window plane 27.

The four positions 24, 25, 26, and 27 are strictly determined by the design of the energy filter 16, and are important optical positions in a case where they are used as constituent elements of the transmission electron microscope equipped with the energy filter 16. The positions must be strictly secured in order to minimize the distortions in the image created by the energy filter 16 and to secure imaging functions similar to the functions of a normal TEM. The four positions 24-27 are defined in any structure of filter, as well as in an Omega filter.

In the transmission electron microscope equipped with the energy filter 16, the magnified image 23 of the specimen 10 produced by the strongly excited objective lens 11 is demagnified into the image 21 by the objective minilens 12. Since the image is demagnified in this way by the objective minilens 12 located immediately behind the main objective lens 11, a sharply focused beam of electrons enters the first intermediate lens 13. Consequently, the effects of off-axis aberrations in the intermediate lens system consisting of the first intermediate lens 13, second intermediate lens 14, and third intermediate lens 15 can be reduced greatly. The three intermediate lenses 13-15 create a crossover image and a microscope image in the entrance window plane 24 and entrance image plane 25. The energy filter 16 creates a microscope image and a crossover image in the exit image plane 26 and exit window plane 27. The output image 26 from the energy filter 16 is projected onto the final image plane 20 by the first projector lens 18 and second projector lens 19.

As described so far, the electron microscope equipped with the energy filter shown in FIG. 1 can well create an image of peripheral portions in the final image plane 20, the peripheral portions being remote from the center. Furthermore, aberrations in the intermediate lenses 13-15 affecting the size of the crossover image at the entrance window plane 24 can be reduced. As a result, the size of the crossover image at the exit window plane 27 is reduced. Hence, the accuracy at which energy selection is made by the energy-selecting slit 17 can be enhanced.

Figure 3:
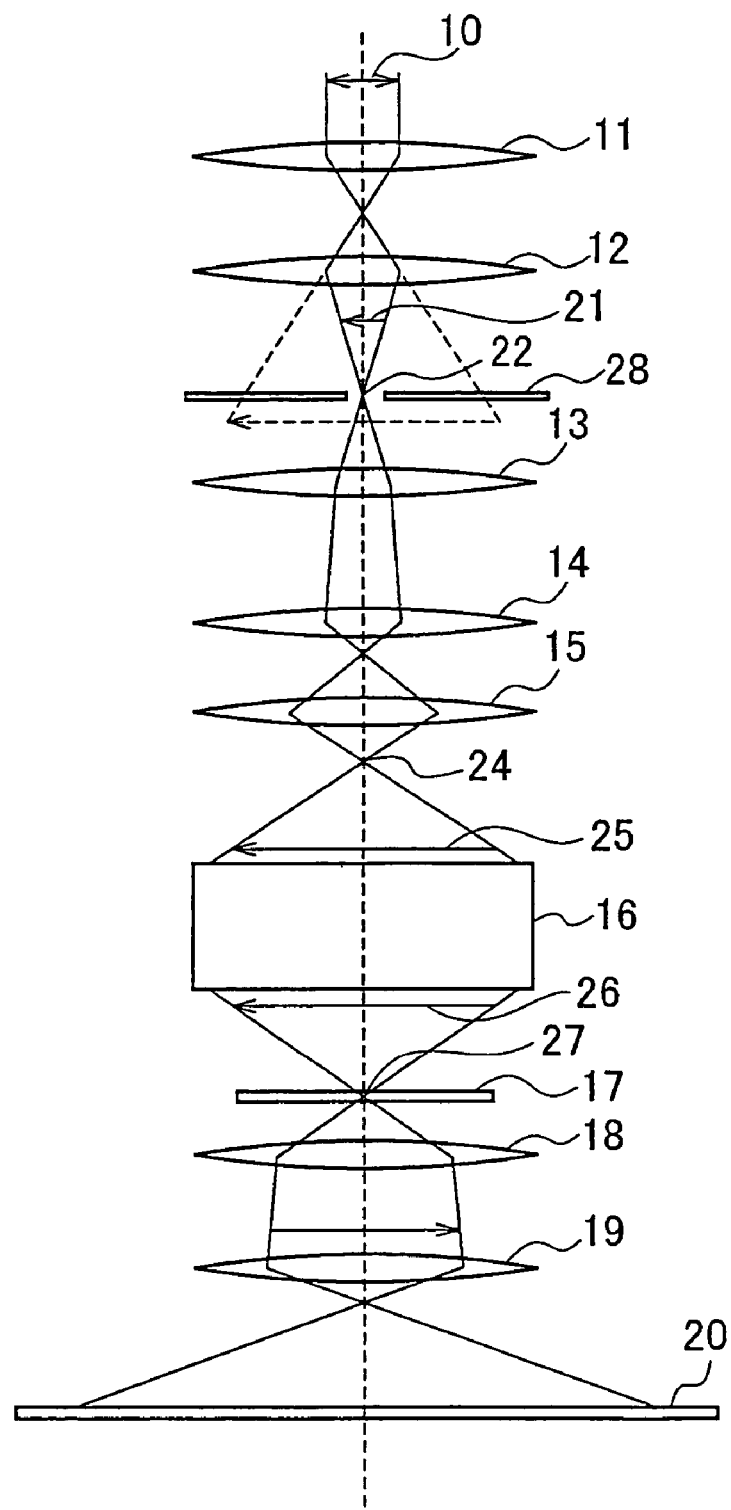
FIG. 3 is a ray diagram of an electron microscope according to a second embodiment of the present invention.

FIG. 3 is a diagram showing a transmission electron microscope according to a second embodiment of the present invention. This microscope is similar to the microscope already described in connection with FIG. 1 except that a movable aperture 28 is mounted in an electron beam crossover position 22 formed by the objective minilens 12, the position 22 being closer to the minilens 12 than the first intermediate lens 13.

The aperture 28 can be used instead of the objective aperture by bringing the crossover position 22 into coincidence with the position of the aperture 28. This aperture 28 may be a field-limiting aperture installed in a normal electron microscope. Where a sufficient gap space to accommodate an objective aperture installed in the polepiece gap of the normal objective lens 11 cannot be secured, such a field-limiting aperture may be used to advantage.

Of course, the electron microscope equipped with an energy filter according to the second embodiment can well create an image of peripheral portions in the final image plane 20, the peripheral portions being remote from the center. Furthermore, aberrations in the first intermediate lens 13, second intermediate lens 14, and third intermediate lens 15 which affect the size of the crossover image at the entrance window plane 24 can be reduced. The result is that the size of the crossover image in the exit window plane 27 is reduced. In consequence, the accuracy at which energy selection is made by the energy-selecting slit 17 can be enhanced.

Figure 4:
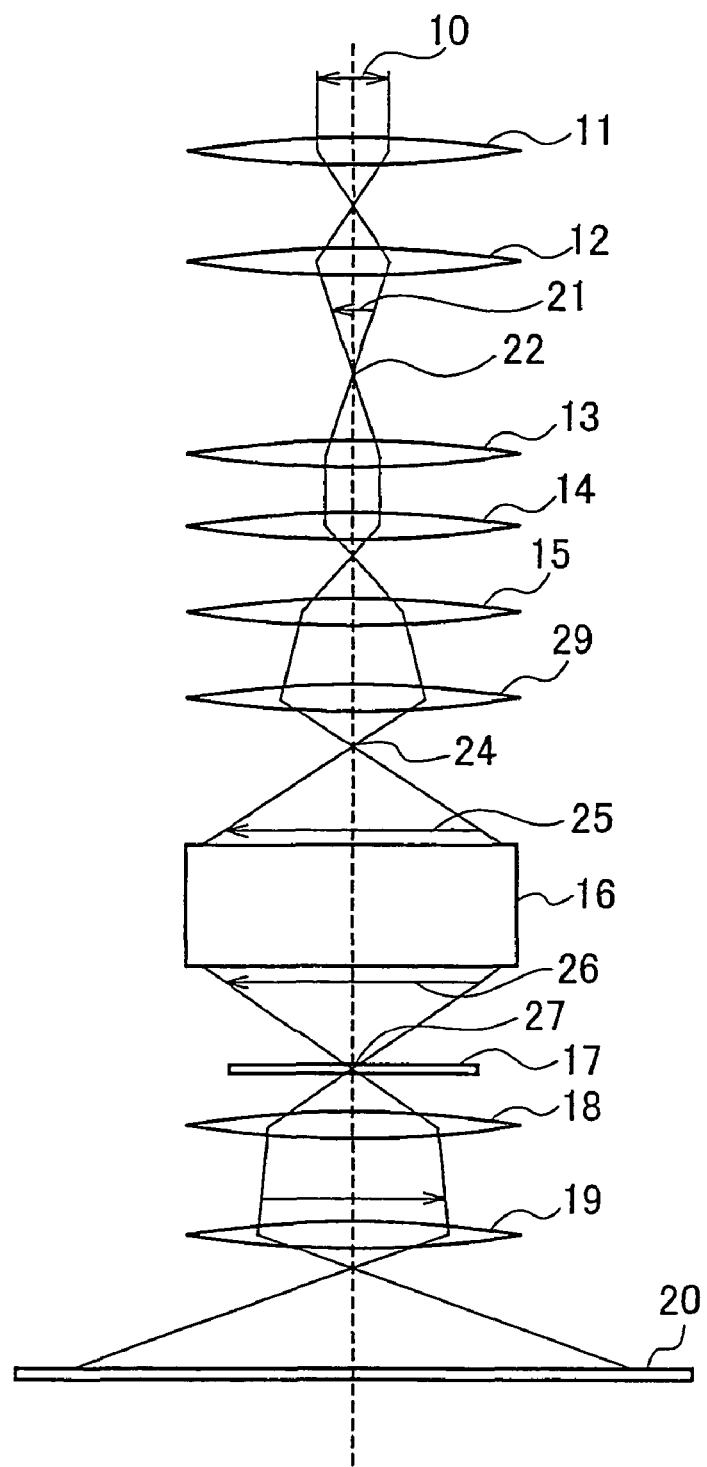
FIG. 4 is a ray diagram of an electron microscope according to a third embodiment of the present invention.
Figure 5:
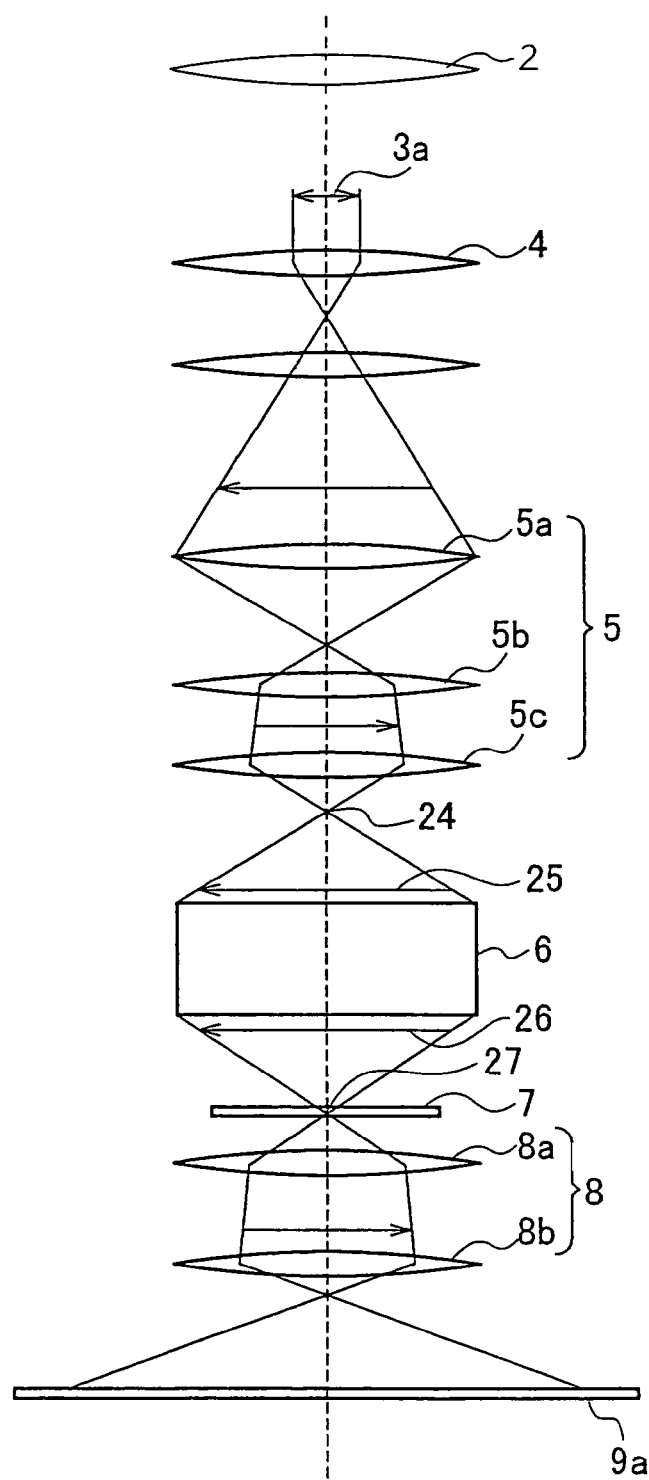
FIG. 5 is a ray diagram of a transmission electron microscope equipped with an energy filter, showing from a specimen to the final image plane.

FIG. 4 is a diagram showing a transmission electron microscope according to a third embodiment of the present invention. In the first and second embodiments described above, the intermediate lens system is made up of three stages. The projector lens system is made up of two stages. Advantageously, the intermediate lens system may be made up of four or more stages, and the projector lens system may be made up of three or more stages. That is, as shown in FIG. 4, in the third embodiment, the intermediate lens system has a fourth intermediate lens 29 positioned between the third intermediate lens and energy filter 16, in addition to the first intermediate lens 13, second intermediate lens 14, and third intermediate lens 15.

The gist of the present invention is that electrons are introduced into the intermediate lens system as a sharply focused electron beam, i.e., at a low magnification, without sacrificing the high resolution of the objective lens 11 by the provision of the objective minilens 21. This method has no relationship to the number of stages of the intermediate lens system or the number of stages of the projector lens system.

In the third embodiment, the number of intermediate lenses is increased to four, and the projector lens system is made up of two stages as shown in FIG. 4. As described previously, the provision of the objective minilens 21 permits electrons to be introduced as a sharply focused electron beam (i.e., at a low magnification) into the intermediate lens system without sacrificing the high resolution of the objective lens 11. Therefore, an image of peripheral portions remote from the center can be well formed in the final image plane. Furthermore, aberrations in the intermediate lenses which affect the size of the crossover image at the entrance window plane 24 of the energy filter 16 can be reduced. As a result, the size of the crossover image at the exit window plane 27 is reduced. The accuracy at which energy selection is made by the energy-selecting slit 17 can be enhanced.

The electron microscope of the present embodiment can be applied also to electron energy loss spectroscopy (EELS). As mentioned previously, the size of the crossover image is small in the electron microscope of the present embodiment. Therefore, the accuracy of energy selection can be enhanced. Accordingly, high-resolution EELS is enabled.

Having thus described my invention with the detail and particularity required by the Patent Laws, what is desired protected by Letters Patent is set forth in the following claims.

The invention claimed is:

1. An electron microscope comprising:
a main objective lens for creating a magnified image of a specimen;
an objective minilens for demagnifying the magnified image;
an intermediate lens system; and
an energy filter having an entrance window plane,
wherein said intermediate lens system creates a crossover image in the entrance window plane of the energy filter in response to the image demagnified by the objective minilens.

2. The electron microscope of claim 1, further including a projector lens system for focusing an output image from said energy filter onto a final image plane.

3. The electron microscope of claim 1, wherein said main objective lens can be used alone as well as in conjunction with said objective minilens.

4. The electron microscope of claim 1, wherein the magnified image created by said main objective lens is formed by strongly exciting said main objective lens.

5. The electron microscope of claim 1, wherein a field-limiting aperture is mounted immediately ahead of said intermediate lens system and at a crossover position of the image created by said objective minilens.

6. The electron microscope of claim 2, wherein a field-limiting aperture is mounted immediately ahead of said intermediate lens system and at a crossover position of the image created by said objective minilens.

7. The electron microscope of claim 3, wherein a field-limiting aperture is mounted immediately ahead of said intermediate lens system and at a crossover position of the image created by said objective minilens.

8. The electron microscope of claim 4, wherein a field-limiting aperture is mounted immediately ahead of said intermediate lens system and at a crossover position of the image created by said objective minilens.

* * * * *